United States Patent [19]
Kim et al.

[11] Patent Number: 5,552,635
[45] Date of Patent: Sep. 3, 1996

[54] HIGH THERMAL EMISSIVE SEMICONDUCTOR DEVICE PACKAGE

[75] Inventors: Gu S. Kim, Suwon; Jong G. Kim, Seoul; Seung H. Ahn, Suwon; Jae M. Park, Seoul, all of Rep. of Korea

[73] Assignee: Samsung Electronics Co., Ltd., Suwon, Rep. of Korea

[21] Appl. No.: 370,389

[22] Filed: Jan. 10, 1995

[30] Foreign Application Priority Data

Jan. 11, 1994 [KR] Rep. of Korea .................. 389/1994

[51] Int. Cl.⁶ .................. H01L 23/10; H01L 23/34
[52] U.S. Cl. .................. 257/706; 257/712; 257/707
[58] Field of Search .................. 257/706, 707, 257/712, 704, 718, 719, 720, 722, 787

[56] References Cited

U.S. PATENT DOCUMENTS

| 5,216,278 | 6/1993 | Lin et al. | 257/688 |
| 5,287,001 | 2/1994 | Buchmann et al. | 257/219 |

FOREIGN PATENT DOCUMENTS

| 4-290464 | 10/1992 | Japan | 257/707 |
| 6-29432 | 2/1994 | Japan | 257/706 |

OTHER PUBLICATIONS

Doane et al., "Multichip Module Technologies and Alternatives", Van Nostrand Reinhold, p. 475.
"Immersion Cooled Chips", Electronic Packaging and Production, Jun. 1993, p. 86–R.
"Thermal Elastomer Aids Heat Transfer", Electronics Packaging and Production, Oct. 1993, p. 12.

Primary Examiner—Sara W. Crane
Assistant Examiner—S. V. Clark
Attorney, Agent, or Firm—Cushman Darby & Cushman, L.L.P.

[57] ABSTRACT

Disclosed herein is a high thermal emissive semiconductor device package which comprises a substrate having a plurality of external connection leads, a plurality of connection lands and wires between the leads and the lands; at least one semiconductor chips mounted on the substrate; bonding wires electrically connecting bonding pads of the chip and the connection lands of the substrate; a heat spreader with high thermal conductivity, which is attached to the upper surface of the bonding pads of the chip by insulating adhesives with good thermal conductivity; and a metal cap which is in contact with the upper surface of the heat spreader via thermal compounds and encapsulates the whole components by being sealed to the substrate.

The high thermal emissive semiconductor device packages have advantageous that they efficiently emit heat generated during the operation of components and that they may be applied to various semiconductor devices which can be produced at low costs.

7 Claims, 4 Drawing Sheets

HIGH THERMAL EMISSIVE SEMICONDUCTOR DEVICE PACKAGE

BACKGROUND OF THE INVENTION

1. Field of the Invention

The present invention is related to high thermal emissive semiconductor device packages, and more particularly it is related to high thermal emissive structures which can be applied to high speed or high clock frequency devices such as application specific integrated circuits(ASICs), or fast memory devices so that they efficiently emit heat generated by electrical components.

2. Prior Art

Thermal emission is one of the very important properties required for semiconductor devices. Particularly, for high speed and high power semiconductor devices, thermal emission becomes more important.

The thermal emissive structures which are on-going developments or have been developed may be classified into two classes: (1) plastic pad array packages in which a power transistor or module is provided with a heat sink, and (2) metal housed ceramic substrates.

Most of the high speed and high power microprocessors, ASICs or fast memory devices have multi-pin input/output terminals, and the semiconductor devices employed for manufacturing these devices also should have a corresponding multi-pin configuration. For this purpose, plastic or ceramic pin grid array carrier packages, land grid array carrier packages, ball grid array carrier packages or quad flat carrier packages are employed.

However, applications of these carrier packages made of conventional materials to high power apparatus are restricted due to their poor thermal emissive properties.

Referring to FIG. 1, which shows one example of conventional thermal emissive semiconductor packages, in the form of a pin grid array carrier package, the package (10) consists of a ceramic substrate (11) having a plurality of signal input and output terminals (12), a semiconductor chip (14) having solder bumps (13) and being mounted on the ceramic substrate (11), a thermal compound (15) mounted onto the semiconductor chip (14), a metal cap (16) which encases the whole components, and a heat sink (17) mounted on the metal cap ((16).

In the package (10), heat generated during the operation of chip (14) is dissipated in directions indicated by arrows, and the heat moved upward is efficiently emitted by aid of the thermal compound (15).

Such structure is commonly applied to multi-chip module packages. However, this structure of packages has a problem that the formation of solder bumps (13) on the lower surface of the chip (14) for the purpose of mounting the chip (14) onto the ceramic substrate (11) is difficult to do.

Referring to FIG. 2, which shows another example of conventional cavity-down thermal emissive semiconductor packages, in the form of pin grid array carrier package, the package (20) consists of a ceramic substrate (21) which has a cavity at the central bottom and has a plurality of signal input and output terminals (22) at both ends, a semiconductor chip (24) which is back-bonded to the substrate (21) by a die-attach material (25) within the cavity, a lid (23) provided for protecting the chip (24) below the substrate (21), and a heat sink (27) which is mounted onto the substrate (21) by an interface material (28).

In the thermal emissive package (20) shown in FIG. 2, the heat is efficiently dissipated in the directions indicated by the arrows. However, this structure of package has a problem that a sufficient large number of pins can not be provided.

Referring to FIG. 3, which shows another example of conventional cavity-up thermal emissive semiconductor structures, in the form of a pin grid array carrier package, the package (30) consists of a ceramic substrate (31) which has a cavity at the central top and has a plurality of signal input and output terminals (32) at the lower surface, a semiconductor chip (34) which is back-bonded to the substrate (31) by a die-attach material (35) within the cavity, a lid (37) provided for protecting the chip (34) onto the substrate (31), and a heat sink (39) which is mounted onto the lid (37) by an interface material (38).

In the thermal emissive package (30) shown in FIG. 3, the heat is efficiently dissipated in the directions indicated by the arrows. However, this package has a drawback that heat dissipation is restricted because the heat generated from the upper surface of the chip (34) is dissipated through the lower surface of the chip (31) to the side surface of the chip (31).

Further, the above described packages (10), (20) and (30) are disadvantageous in that applications of these packages to other substrates than ceramic ones are restricted, due to complexicity of the manufacturing process.

In FIG. 4, another example of a thermal emissive ball grid array carrier package is illustrated. The package (40), which is disclosed in U.S. Pat. No. 5,216,278, comprises a carrier substrate (41) provided with a pair of filled vias (42), a solder mask (45) overlying the package mounting surface (46), a plurality of vias (43) in a plated wire layer (44) located in the both ends of the substrate (41), an electronic component (47) mounted on the die pad of the substrate (41), a wire (48) between the bonding pads on the electronic component (47) and wire layer (44), a thermal coupling layer (49) mounted on the upper surface of the electronic component (47), a heat spreader (51) mounted on the upper surface of the package (40), a molded package body (52), and solder balls (53), (54) formed on the lower surface of the solder mask (45).

In the ball grid array package shown in FIG. 4, the heat generated from the upper surface of the electronic component (47) is dissipated through the thermal coupling layer (49) and heat spreader (51), while the heat generated from the lower surface of the component (47) is dissipated to the vias (43). However, because the heat dissipation path is formed within a package body (52) molded with epoxy molding resin (EMC), of heat dissipation is not efficiently conducted. Further, it is difficult to form the thermal coupling layer (49) and heat spreader (51) on the upper surface of the electronic component (47) and to form solder balls on the lower surface of the component (47).

To avoid these prior art problems, there was proposed a package employing an immersion cooling chip as shown in FIGS. 5(A) and 5(B).

Referring to FIG. 5(A), there is shown a high thermal emissive package employing an immersion cooling chip, which comprises a multilayered ceramic substrate (61) having a cavity, a plurality of signal input and output terminals (62) formed on the lower surface of the substrate (61), a semiconductor chip (64) mounted within the cavity of the substrate (61), a dielectric liquid (65) filling the cavity, and a metal cap (66) covered the dielectric liquid.

Referring to FIG. 5(B), there is shown another high thermal emissive package employing an immersion cooling chip, which comprises a multilayered ceramic substrate (61)

having a cavity, a plurality of signal input and output terminals (62) formed on the lower surface of the substrate (61), a semiconductor chip (64) mounted within the cavity of the substrate (61), a dielectric liquid (65) filling the cavity, an encapsulating metal cap (66), and a heat sink (67) mounted onto the metal cap (66).

For these packages, the heat generated during the operation of electronic components is dissipated via vaporization and condensation of the dielectric liquid. However, there is a severe restriction in heat dissipation, because the chip is not directly contacted to the metal cap on which the heat sink is optionally mounted.

Therefore, there are needs to be provided various efficient thermal transfer structures which can be applied to conventional carrier, pad array or cavity up type semiconductor device packages.

SUMMARY OF THE INVENTION

Thus, an object of the invention is to provide various efficient thermal transfer structures which can be applied to conventional carrier, pad array or cavity up type semiconductor device packages.

Another object of the invention is to provide thermal transfer structures having various heat spreaders, which allow the manufacture of high thermal emissive semiconductor device packages at low production costs.

Yet another object of the invention is to provide high thermal emissive semiconductor device packages, which comprise a substrate having a plurality of external connection leads, a plurality of connection lands and wires between the leads and the lands; at least one semiconductor chip mounted on the substrate; bonding wires electrically connecting the bonding pads of the chip and the connection lands of the substrate; a heat spreader with high thermal conductivity, which is attached to the upper surface of the bonding pads of the chip by insulating adhesives with good thermal conductivity; and a metal cap which is in contact with the upper surface of the heat spreader via thermal compounds and encapsulates the whole of the components by being sealed to the substrate.

Still another object of the invention is to provide high thermal emissive semiconductor device packages, which comprise a substrate having a plurality of external connection leads, a plurality of connection lands and wires between the leads and lands and having at least one hole; at least one semiconductor chip mounted on the substrate; bonding wires which electrically connect bonding pads of the chip and the connection lands; a metal cap which encases the above descirbed components and has a hole; and a dielectric liquid filling the internal space formed by the metal cap.

Another object of the invention is to provide high thermal emissive semiconductor device packages, which comprise a substrate having a plurality of external connection leads, a plurality of connection lands and wires between the leads and lands; at least one semiconductor chip mounted on the substrate; bonding wires electrically connecting the bonding pads of the chip and the connection lands; and a metal cap which is adhered to the upper surface of the chip via thermal compounds and covers the above described components.

BRIEF DESCRIPTION OF THE DRAWINGS

For a more complete understanding of the present invention, and for further advantages thereof, reference is now made to the following detailed description, taken in conjunction with the accompanying drawings, in which.

DETAILED DESCRIPTION OF THE PREFERRED EMBODIMENTS OF THE INVENTION

Figure 1:
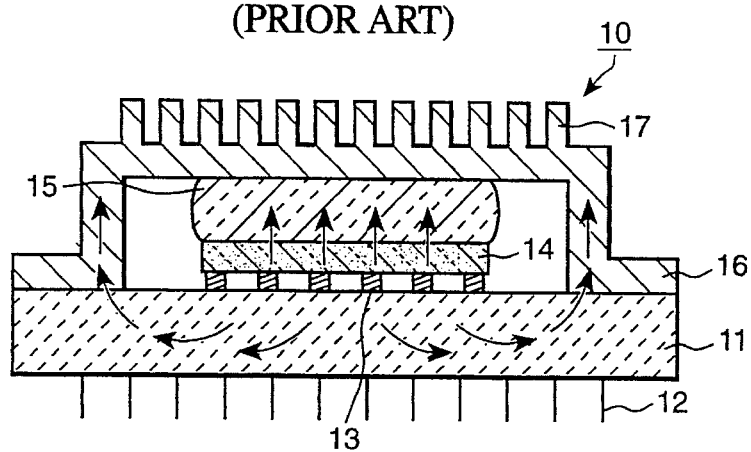
FIGS. 1 through 4 show conventional high thermal emissive semiconductor packages.
Figure 2:
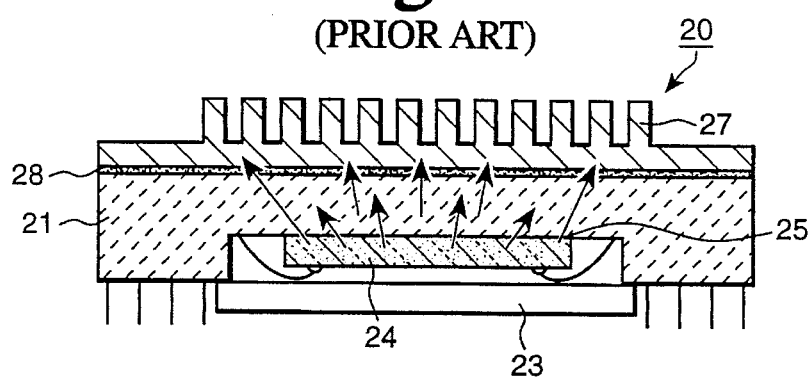
Figure 3:
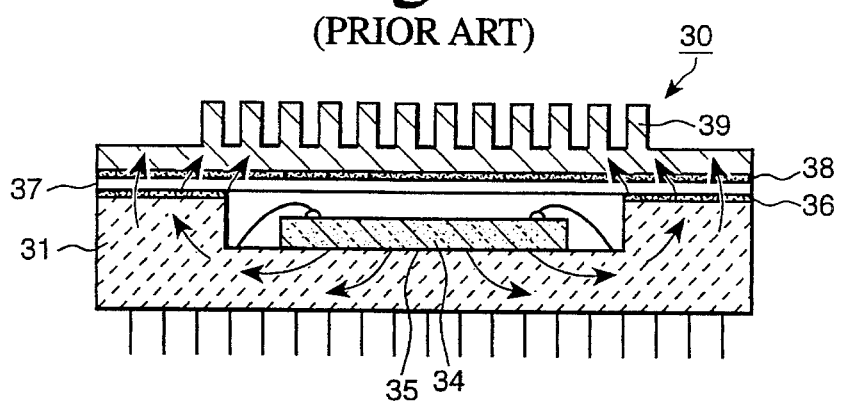
Figure 4:
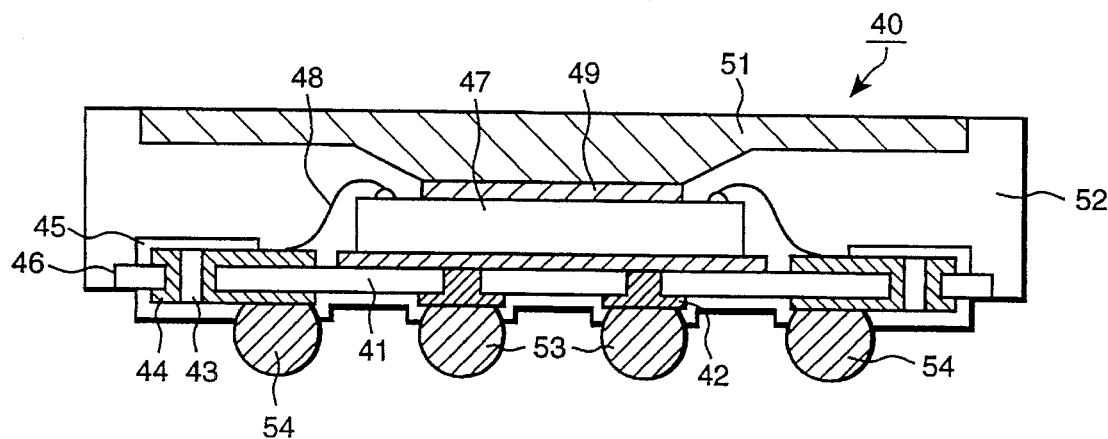
Figure 5A:
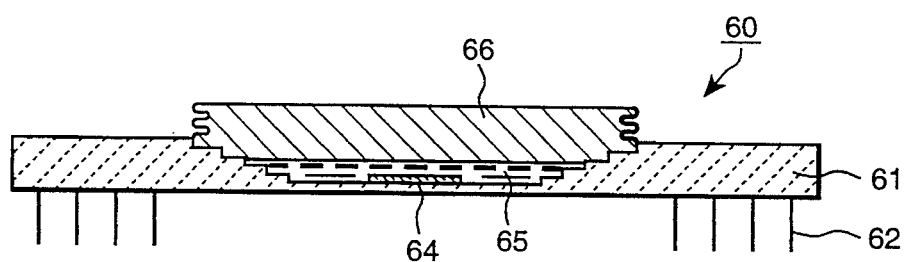
FIGS. 5(A) and 5(B) show conventional high thermal emissive semiconductor packages employing liquid-immersed cooling chips.
Figure 5B:
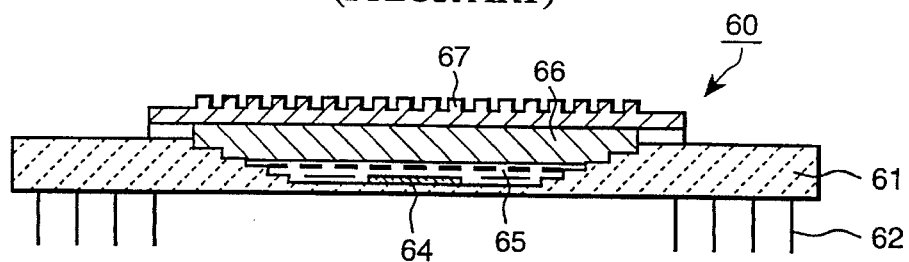
Figure 6:
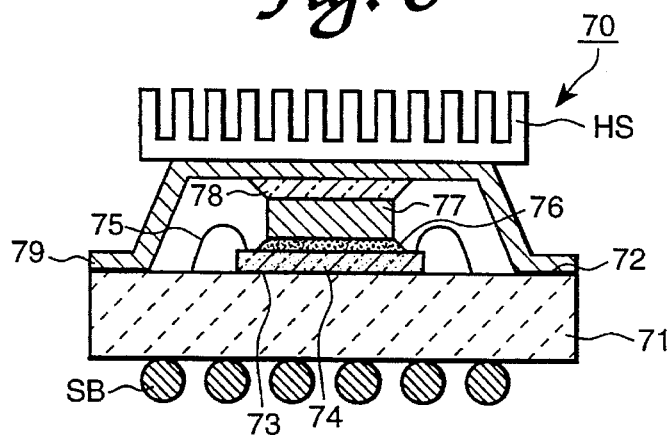
FIG. 6 shows the first embodiment of a high thermal emissive semiconductor device package according to the present invention.

Reference is made to FIG. 6, which shows one embodiment of a high thermal emissive semiconductor device package according to the present invention. It includes a substrate (71) having a plurality of solder balls (SB), a plurality of external connection leads, a plurality of connection lands and wires between the leads and lands, and a metal cap (79) which is adhered to the upper surface of the substrate (71) by using a seal material (72).

The substrate (71) may be any one of a printed circuit board, or ceramic, metal, or silicon substrate, which can be applied to various semiconductor packages such as pin grid array, land grid array or ball grid array carrier packages.

A semiconductor chip (74) is mounted on the die pad (73) of the substrate (71), and a bonding pad (not shown) of the chip (74) is electrically connected by wiring bonding, to a connection land(not shown) of the substrate (71).

The connection between the die pad and the bonding pad may also be accomplished by using TAB technology.

The upper surface of the chip (74) is applied with adhesive (76) on the inner side of the bonding pad only. The adhesive (76) should not affect the surface of the chip (74), and should appropriately support the heat spreader (77).

The adhesive (76) is of non-conductive thermoplastic epoxy type and applied in thickness of 2 mil. The adhesive (76) is filled with high thermal conductive materials such as AlN particles of 150–220 W/m°K. or diamond particles of 1200–2300 W/m°K., these particles having round shapes, in order not to scratch the surface of the chip (74).

There is mounted a heat spreader (77) on the adhesive (76). As shown in FIGS. 10(A) through 10(D), the heat spreader (77) may be any type of flat (10(A)), single folded (10(B)), both sides folded (10(C)) or S-shaped (10(D)) shape. Alternatively, it may have a radial finger shape.

More particularly, the heat spreader (77) is mounted between the adhesive (76) and the thermal compound (78) which will be described below.

Figure 10A:
FIGS. 10(A) through 10(D) show examples of various shapes of heat spreaders which can be employed in the high thermal emissive semiconductor device package of the present invention.
Figure 10B:
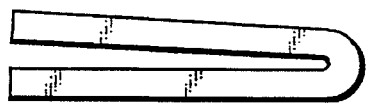
Figure 10C:
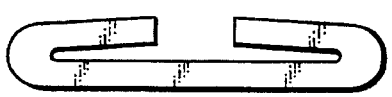
Figure 10D:
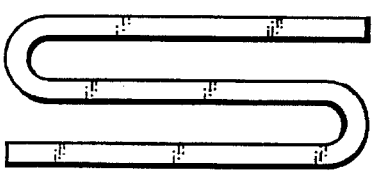

The heat spreader (77) may be made of any one selected from copper, copper alloys, aluminum, aluminum alloys, steel, and stainless steel, all of which have high thermal conductivity. For the present invention, a heat spreader (77)

which is made of copper, having a thickness of 2 mil, a thermal conductivity of 398 W/m°K., and which has single folded form as shown in FIG. 10(B) is preferably used.

The thus constructed package is then covered with a metal cap (79). It is preferable to dot thermal compounds (78) as a heat dissipation means between the heat spreader (77) and the metal cap (79), in order to improve the tightness and heat distribution.

In the present invention, as the thermal compound (78), silicone gel distributed under the trade name of TSE 3280G by Toshiba, Japan is employed. As the thermal compound, any thermal elastomers or non electric conductive materials having high thermal conductivity also can be employed. The non-electric conductive materials may include, but not be limited to, high thermal conductive epoxy polyimides.

The metal cap (79) may be made of aluminum alloys, copper alloys or stainless steel.

Accordingly, the metal cap (79) is closely adhered to the substrate (71) by the seal material (72), and the thermal compound (78) is cured when the seal material (72) is cured.

Further, if necessary, the heat sink (HS) may be mounted on the metal cap (79) in order to improve heat dissipation. The heat sink may have a fin shape.

Figure 7:
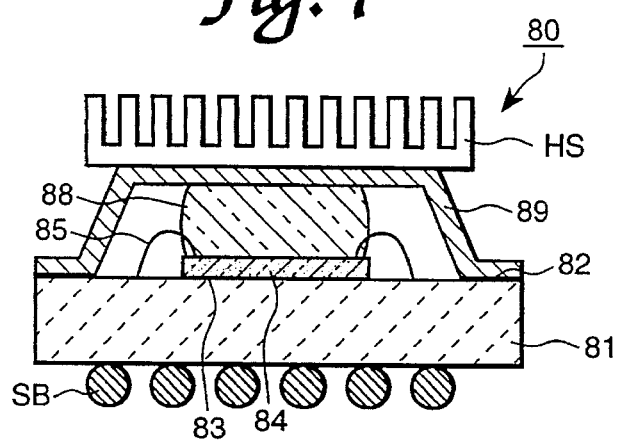
FIG. 7 shows the second embodiment according to the present invention.

FIG. 7 shows another embodiment of the high thermal emissive semiconductor package provided in accordance with the present invention, wherein only the thermal compound is employed to enhance heat dissipation.

Referring to FIG. 7, a semiconductor chip (84) is shown mounted on the die pad (83) of the substrate (81), and a bonding pad (not shown) of the chip (84) is electrically connected by wiring bonding (85) to a connection land(not shown) of the substrate (81). The connection between the die pad and the bonding pad may also be accomplished by using TAB technology, as in the case of the package shown in FIG. 6.

The upper surface of the chip (84) is applied with a thermal compound (88), having round shapes, and then a metal cap (89) is adhered thereto.

The thermal compound (88) may be made of silicone gel or thermal elastomers. Because the thermal compound (88) has an inferior thermal conductivity relative to metals, it is preferable that it be directly adhered to the upper surface of the chip (84), which requires heat dissipation.

The thermal compound (88) is formed as a thick layer between the upper surface of the chip (84) and the metal cap (89).

Accordingly, the metal cap (89) is closely adhered to the substrate (81) by the seal material (82), and the thermal compound (88) is cured when the seal material (82) is cured.

Further, if necessary, a heat sink (HS) may be mounted on the metal cap (79) in order to improve the heat dissipation. The heat sink may have a fin shape.

Figure 8:
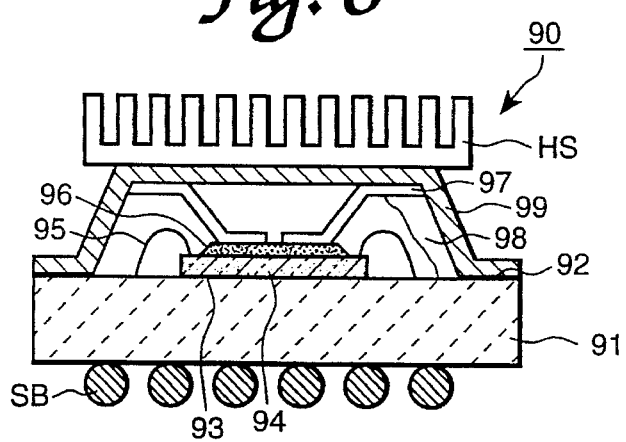
FIG. 8 shows the third embodiment according to the present invention.

FIG. 8 shows another embodiment of the a high thermal emissive semiconductor packages in accordance with the present invention, wherein heat spreaders (97), each in the form of a radial finger, are mounted on the chip (94) and extend to the metal cap (99).

Referring to FIG. 8, the semiconductor chip (94) is mounted on the die pad (93) of the substrate (91), and a bonding pad (not shown) of the chip (84) is electrically connected by wiring bonding (95) to a connection land(not shown) of the substrate (91).

The upper surface of the chip (94) has adhesive (96) applied thereto, the adhesive (96) having round shapes, and then, a plurality of heat spreaders (97), each in the form of a respective radial finger, are adhered thereto.

In order to strongly support the heat spreader (97) by the adhesive (96), there may be applied a thermal compound (98) from the upper surface of the substrate (91) to the upper end of the heat spreader (97).

In this package, the substrate (91) is closely bonded to the metal cap (99) by the seal material (92), and the thermal compound (98) is cured when the seal material (92) is cured.

Further, if necessary, a heat sink (HS) may be mounted on the metal cap (99) in order to improve heat dissipation. The heat sink may have a fin shape.

Figure 9:
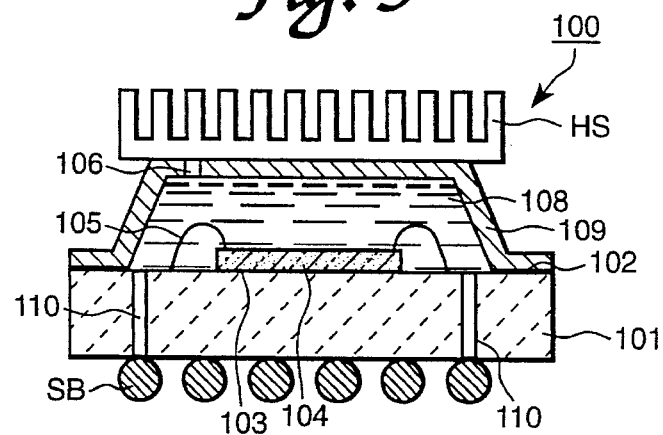
FIG. 9 shows the fourth embodiment according to the present invention.

FIG. 9 shows yet another embodiment of a high thermal emissive semiconductor packages in accordance with the present invention, wherein the substrate (101) is provided with solder balls (SB) on the lower surface and has inflow and outflow holes (110) on both sides, the metal cap (109) which encapsulates the substrate (101) also having a hole (106), and the space formed by encapsulation being filled with a dielectric fluid (108).

Referring to FIG. 9, the semiconductor chip (104) is mounted on the die pad (103) of the substrate (101), and a bonding pad (not shown) of the chip (104) is electrically connected by wiring bonding (105) to a connection land(not shown) of the substrate (101).

Then, the substrate (101) is encased by the metal cap (109), by using a seal material (102). The cavity formed by encapsulation is filled with a dielectric fluid (108) through the hole (106) of the metal cap (109) or through the holes (110) of the substrate (101).

The dielectric fluid (108), which may be employed in the present invention, is mineral oil, containing high thermally conductive materials. The thermally conductivity of the dielectric fluid may be in the range from about 30 to 70 W/m°K. The high thermally conductive materials are exemplified by, but not limited to, boron nitride(BN), which has a thermal conductivity of about 50 W/m°K., aluminum nitiride(AlN) and silicon carbide(SiC). After filled with dielectric fluid, the holes (106), (110) should be sealed with solder or epoxy resin, so that the fluid cannot leak.

Further, if necessary, a heat sink (HS) may be mounted on the metal cap (109), in order to improve heat dissipation. The heat sink may have a fin shape.

As described in connection with describing the various preferred embodiments hereinbefore, the high thermal emissive semiconductor package of the present invention is advantageous in that it allows a high pin count, because a large number of solder ball is formed on the lower surface of the mount substrate, the heat generated from the chip is efficiently dissipated in the upward and downward directions because various types of heat spreaders may be applied, and the production costs are low, because the chip is directly adhered to the metal cap which is optionally provided with a heat sink.

Another object of the invention is to provide various heat spreaders which allows manufacture of high thermal emissive semiconductor device packages at low production costs.

As stated above, the thermal transfer structures can be applied to conventional pin grid array (PGA), land grid array (LGA) or ball grid array (BGA) type semiconductor device packages.

Although the present invention has been illustrated with reference only to structures wherein only one chip is mounted on the substrate, it should be understood that heat transfer structures wherein two or more chips are mounted on the substrate are within the scope and spirit of the present invention.

Furthermore, although the present invention has been described with respect to specific preferred embodiments thereof, various changes and modifications may be suggested to one skilled in the art, and it is intended that the present invention encompass such changes and modifications as fall within the scope of the appended claims.

What is claimed is:

1. A high thermal emissive semiconductor device package, which comprises:

a substrate having a plurality of external connection leads, a plurality of connection lands, and wires between respective of the leads and lands;

at least one semiconductor chip mounted on the substrate, said chip having a plurality of bonding pads having respective upper surfaces;

bonding wires electrically connecting respective of the bonding pads of the chip and the connection lands of the substrate;

a heat spreader having high thermal conductivity, said heat spreader being attached to respective of the upper surfaces of the bonding pads of the chip by insulating adhesive having good thermal conductivity, said heat spreader having an upper surface; said heat spreader being made from a metallic material selected from the group consisting of copper, copper alloy, aluminum, aluminum alloy, steel and stainless steel;

a metal cap which is in contact with the upper surface of the heat spreader via a thermal compound, and which encapsulates said at least one semiconductor chip, said bonding wires, and said heat spreader, by being sealed to the substrate; and a heat sink mounted on said metal cap.

2. The high thermal emissive semiconductor device package of claim 1, wherein:

the heat spreader has a radial finger shape.

3. The high thermal emissive semiconductor device package of claim 1, wherein:

the heat spreader has a form selected from the group consisting of flat, single-folded, both sides folded, and S-shaped, and placed between said adhesive and said thermal compound.

4. The high thermal emissive semiconductor device package of claim 1, wherein:

said adhesive is a thermoplastic epoxy compound.

5. The high thermal emissive semiconductor device package of claim 1, wherein:

said thermal compound is selected from the group consisting of silicone gel and elastomer.

6. A high thermal emissive semiconductor device package, which comprises:

a substrate having a plurality of external connection leads, a plurality of connection lands, and wires between respective of the leads and lands said substrate being provided with at least one hole;

at least one semiconductor chip mounted on the substrate, said chip having a plurality of bonding pads having respective upper surfaces;

bonding wires electrically connecting respective of the bonding pads of the chip and the connection lands of the substrate;

a metal cap, said metal cap encapsulating said at least one semiconductor chip and said bonding wires by being sealed to the substrate; said metal cap and said substrate defining an enclosed space around said at least one semiconductor chip and said bonding wires;

a dielectric fluid filling said space and having a good thermal conductivity; and a heat sink mounted on said metal cap.

7. A high thermal emissive semiconductor device package, which comprises:

a substrate having a plurality of external connection leads, a plurality of connection lands, and wires between respective of the leads and lands;

at least one semiconductor chip mounted on the substrate, said chip having a plurality of bonding pads having respective upper surfaces;

bonding wires electrically connecting respective of the bonding pads of the chip and the connection lands of the substrate;

a metal cap which is spaced from contact with the at least one semiconductor chip by a body of thermal compound and encapsulates said at least one semiconductor chip, said bonding wires and said body of thermal compound by being sealed to the substrate; and a heat sink mounted on said metal cap.

* * * * *